(12) United States Patent
Harrison

(10) Patent No.: US 6,580,278 B1
(45) Date of Patent: Jun. 17, 2003

(54) TECHNIQUE FOR THE MEASUREMENT OF REFLECTION COEFFICIENTS IN STORED ENERGY SYSTEMS

(75) Inventor: Warner George Harrison, Medfield, MA (US)

(73) Assignee: Verizon Laboratories Inc., Waltham, MA (US)

( * ) Notice: Subject to any disclaimer, the term of this patent is extended or adjusted under 35 U.S.C. 154(b) by 0 days.

(21) Appl. No.: 10/047,212

(22) Filed: Jan. 14, 2002

Related U.S. Application Data

(63) Continuation of application No. 09/559,131, filed on Apr. 26, 2000, now Pat. No. 6,366,097.

(51) Int. Cl.[7] .............................................. G01R 27/04
(52) U.S. Cl. .................................. 324/646; 324/76.24
(58) Field of Search ................................. 324/637, 638, 324/639, 642, 646, 601, 613, 76.24

(56) References Cited

U.S. PATENT DOCUMENTS

| | | | | |
|---|---|---|---|---|
| 2,684,467 A | * | 7/1954 | Young et al. ................... 307/73 |
| 3,796,948 A | | 3/1974 | Wentworth ................... 324/630 |
| 4,290,009 A | | 9/1981 | Sampei et al. ............... 324/646 |
| 4,703,433 A | | 10/1987 | Sharrit .......................... 702/76 |
| 4,721,901 A | | 1/1988 | Ashley ......................... 324/646 |
| 4,769,592 A | * | 9/1988 | Potter et al. ................... 324/638 |
| 4,795,886 A | * | 1/1989 | Carter, Jr. ..................... 219/494 |
| 4,816,767 A | | 3/1989 | Cannon et al. ............... 324/601 |
| 5,121,067 A | | 6/1992 | Marsland ...................... 324/637 |
| 5,191,294 A | * | 3/1993 | Grace et al. .................. 324/613 |
| 5,399,977 A | | 3/1995 | Yoshizako et al. ........... 324/645 |
| 5,572,160 A | * | 11/1996 | Wadell .......................... 324/763 |
| 6,249,128 B1 | * | 6/2001 | Begg ............................ 324/601 |

OTHER PUBLICATIONS

Power System Analysis & Design, Second Edition, pp. 477–491. published 1998.*
Signals and Systems, Published 1983, pp. 173–179.*

* cited by examiner

Primary Examiner—N. Le
Assistant Examiner—Vincent Q. Nguyen
(74) Attorney, Agent, or Firm—Leonard Charles Suchyta; James K. Weixel

(57) ABSTRACT

Methods and systems for measuring the reflection coefficient of a network are disclosed. The methods and systems measure the reflection coefficient by exciting a device under test with a driving signal. The driving signal incident on the device under test is measured and the source providing the driving signal is removed thereafter. A signal reflected from the device under test is sampled at a sample rate that may differ from the frequency of the driving signal. The reflection coefficient of the device under test is calculated by dividing the measured level of the reflected signal by the measured level of the driving signal.

11 Claims, 2 Drawing Sheets

TECHNIQUE FOR THE MEASUREMENT OF REFLECTION COEFFICIENTS IN STORED ENERGY SYSTEMS

RELATED APPLICATIONS

The present application is a continuation of U.S. application Ser. No. 09/559,131, filed Apr. 26, 2000. Benefits under 35 USC §120 are claimed.

BACKGROUND OF THE INVENTION

A. Field of the Invention

The present invention relates generally to techniques for measuring characteristics of systems. More particularly, this invention relates to the measurement of the reflection coefficients in stored energy systems.

B. Description of the Related Art

Reflection coefficients have been conventionally calculated by suppressing a forward wave that is incident on a device or transmission line under test (DUT or LUT), measuring a wave reflected from the DUT or LUT, and calculating the ratio of the reflected wave to the forward wave. Alternatively, the reflection coefficients have been calculated by measuring a standing wave produced by the combination of forward and reflected waves.

The forward wave may be suppressed by a directional coupler or a directional bridge. The use of a coupler or bridge presents difficulties for wideband measurements. For example, the balance in bridges depends on how well the impedance of the DUT or LUT matches the impedance of the bridge. A good match is hard to achieve between conventional twisted-pair lines associated with the DUT and a bridge.

Impedance matching is also a problem associated with the use of directional couplers. Specifically, it is difficult to achieve good impedance matches both at the interface between the directional coupler and the measurement device, and at the interface between the directional coupler and the DUT or LUT. Furthermore, even in systems that are well matched, when the signal reflected from the DUT or LUT has a low magnitude it becomes extremely difficult to calculate the reflection coefficient by measuring the composite signal (i.e., the reflected signal and the forward signal). Therefore, there is a need in the art for a reflection coefficient measurement system that allows the conventional suppression of a forward wave while also suppressing the reflections that occur as a result of the mismatch at the interface between the DUT or LUT and the instrument used for suppressing the forward wave. Further, there is a need in the art for increasing the dynamic range of the measurement system by enabling the efficient calculation of reflection coefficients when the reflected wave has a low voltage level.

SUMMARY OF THE INVENTION

Accordingly, it is an objective of the present invention to meet the foregoing needs by providing systems and methods for measuring reflection coefficients.

Methods and systems consistent with the present invention measure reflection coefficients by exciting a device under test with a driving signal and measuring the driving signal incident on the device under test. After the driving signal level is measured, the source providing the driving signal is removed. A signal reflected from the device under test is sampled at a sample time that may differ from the frequency of the driving signal. Finally, the reflection coefficient of the device under test is calculated by dividing the measured level of the reflected signal by the measured level of the driving signal.

Both the foregoing general description and the following detailed description provide examples and explanations only. They do not restrict the claimed invention.

DESCRIPTION OF THE DRAWINGS

The accompanying drawings, which are incorporated in and constitute a part of the specification, illustrate embodiments of the invention and, together with the description, explain the advantages and principles of the invention. In the drawings.

DETAILED DESCRIPTION

Figure 1:
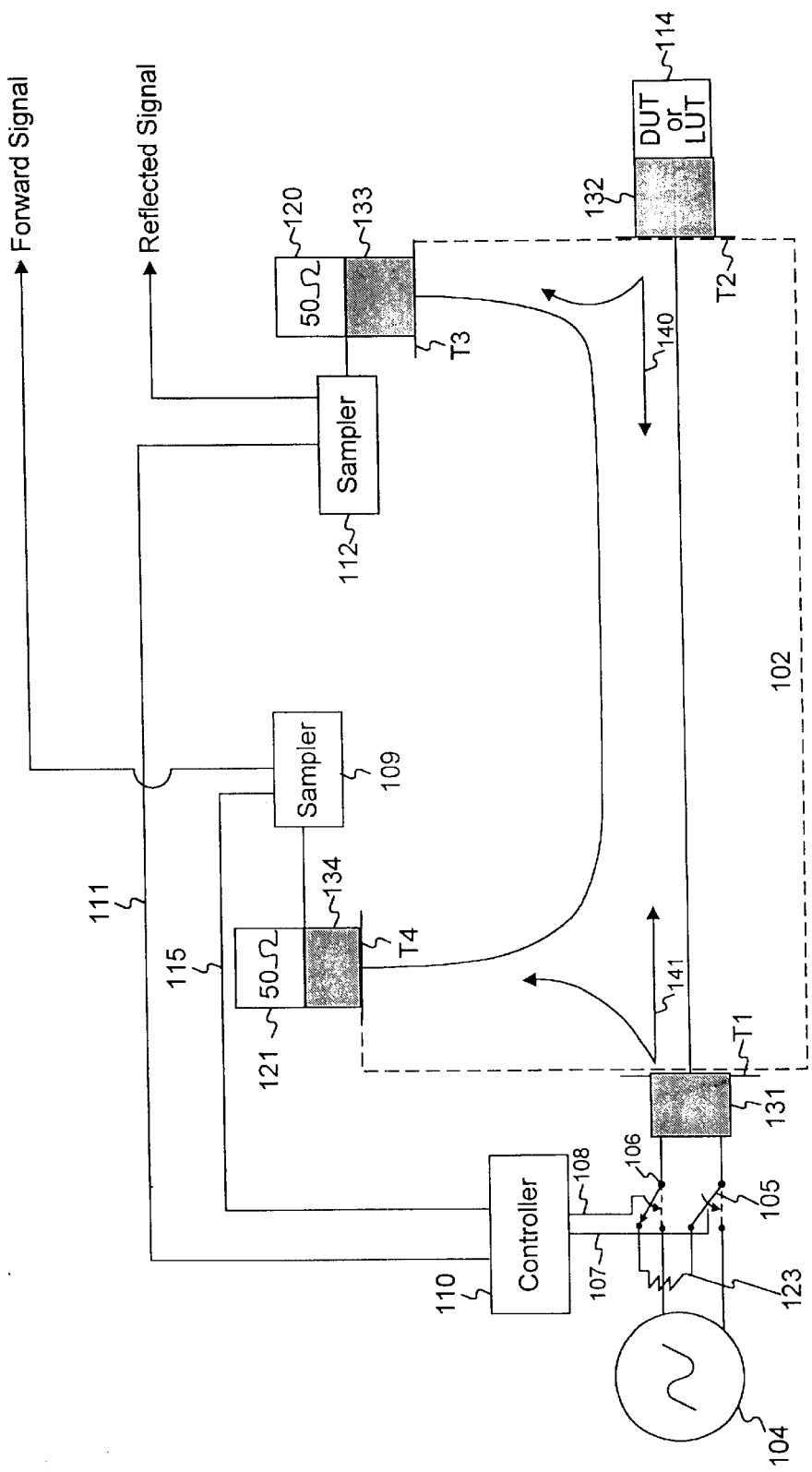
FIG. 1 illustrates one embodiment of the present invention for measuring reflection coefficients of a device or transmission line under test, in accordance with methods and systems consistent with the present invention.

Reference will now be made to preferred embodiments of this invention, examples of which are shown in the accompanying drawings and made in accordance with the description of the invention. In the drawings, the same reference numbers represent the same or similar elements in the different drawings whenever possible.

Systems and methods consistent with the present invention measure reflection coefficients by using the terminals from a directional coupler to provide the DUT with a forward signal and to measure the signal reflected from the DUT. The description should be understood to apply in general to the measurement of reflection coefficients with the use of a directional bridge or any other instrument that facilitates the propagation of waves in a given direction.

In the present invention, reflections may be measured by first exciting the device or line under test with a single frequency source. The source drives a propagating forward wave into the line and discontinuities along the line to set-up a reflection pattern on the line. A standing wave is formed by the interference of the forward and reflected waves.

The source power is removed prior to the measurement of the standing wave at the driving port of the DUT or LUT and only the reflected waves reach the measurement port. By delaying the sampling of the reflected signal with respect to the removal of the source power, the disclosed method suppresses reflections near the source. The sampling rate used in sampling the reflected signal may be different from the driving frequency, allowing one sampling channel to recover both phase and amplitude information of the reflected signal. The driving signal may be recovered either by direct measurement of the forward signal or by simultaneous measurement of the forward and reflected signals.

FIG. 1 shows a system 100 for measuring the reflection coefficient of a DUT or LUT in accordance with systems and methods of the present invention. The system 100 includes a directional coupler 102, a driving signal source 104, a controller 110, switches 105 and 106, samplers 112 and 109, a DUT or LUT 114, connectors 131–134, and matching loads 120–121.

The directional coupler 102 includes four terminals T1–T4. The functionality of the directional coupler 102 should be apparent to a person of ordinary skill. For example, when a signal is applied to terminal T1 and the remaining terminals T2–T4 are matched, portions of the signal are incident on terminals T4 and T2 but not on terminal T3, as indicated by the split arrow 141. The level of the signal incident on terminal T4 may be a fraction of that incident on T2. This fraction may be expressed in terms of decibels of attenuation. Likewise, when a signal is applied to terminal T2 and the remaining terminals T1 and T3–T4 are matched, parts of the signal are incident on terminals T1 and T3 but not on terminal T4, as indicated by the split arrow 140.

The driving signal source 104 may be a voltage source operating at a single frequency. The controller 110 may be a sequenced timing circuit for controlling the sampler 112 and for disconnecting the voltage source 104. The switches 105 and 106 may be conventional electronic switches each having a terminal dedicated to the reception of control signals. The control signals set the switches in either a closed or open state.

The sampler 112 may be a conventional analog to digital converter with a sampling rate that may be adjusted to differ from the frequency of the driving signal source 104. Setting the sampling rate to a value different from the source frequency allows one sampling channel to recover both phase and amplitude information which may be used in the calculation of the reflection coefficients.

The DUT or LUT 114 may be a network which includes distributed or lumped elements. The term DUT is preferably used when the network comprises lumped elements, while the term LUT is preferably used when the network comprises distributed elements.

The driving signal source 104 supplies a forward wave to the directional coupler 102 when the switches 105 and 106 are closed. The switches 105 and 106 close when the controller 110 so requires by sending two control signals over lines 107 and 108. Although the system 100 shows balanced lines associated with the forward wave transmission path via switches 105 and 106, this need not be the case. The method discussed below with reference to the system 100 also applies to unbalanced systems.

When the forward wave arrives at terminal T4 it does not experience a reflection because the load 121 is matched to the directional coupler 102. To obtain a match between the load 121 and the coupler 102 the load 121 may assume a value of 50 ohms when the coupler has a 50 ohms characteristic impedance. A portion of the forward wave arrives at terminal T2, where it further travels through connector 132 and DUT 114.

The controller 110 controls the supply of the forward wave to the DUT 114 by disconnecting the driving signal source 104 from the directional coupler 102. After cutting off the supply of the forward wave to the DUT 114, the controller 110 directs the sampler 112 to initiate the sampling of the signal present at connector 133 which is a fraction of the wave reflected from the DUT 114. The reflected wave is terminated in matched loads 120 and 123. The controller sends the sampler control signal via the line 111. The sampler control signal is delayed with respect to the switch control signals sent by the controller 110 over lines 107 and 108.

If sampling is performed at the driving source frequency or a sub-harmonic of this frequency, both in-phase and quadrature samples are required from the samplers in order to measure the phase of the forward and reflected waves. If the forward and reflected waves are sampled at a non-harmonic frequency, a pair of sinusoids is generated which may be used to measure the phase and amplitude of the reflection coefficient.

Figure 2:
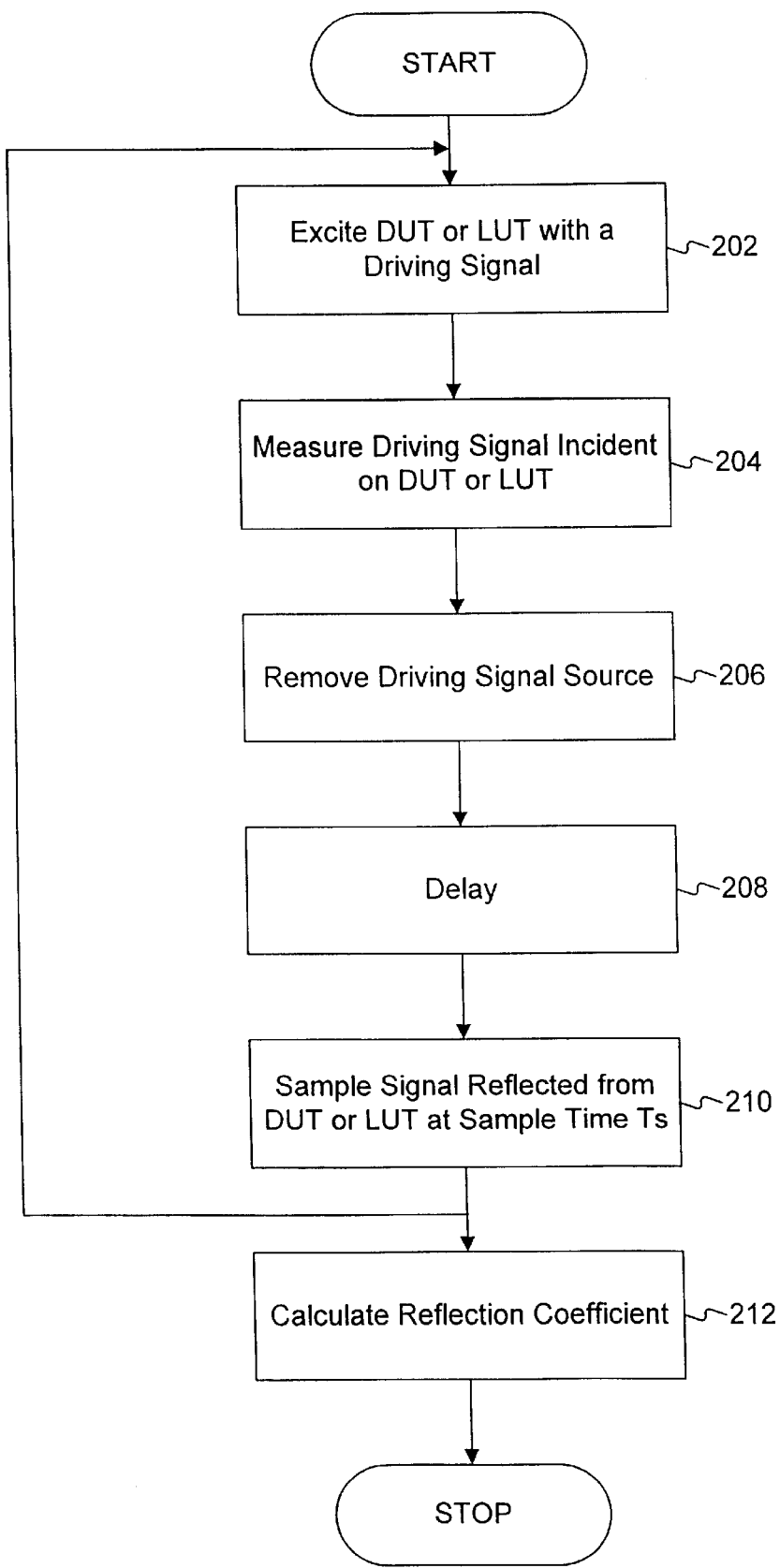
FIG. 2 illustrates a flowchart of a method for measuring reflection coefficients, in accordance with methods and systems consistent with the present invention.

FIG. 2 illustrates a flowchart of a method for measuring reflection coefficients, in accordance with methods and systems consistent with the present invention. Step 202 includes exciting a DUT or LUT 114 with a driving signal. Step 204 includes the measurement of the driving signal incident on the DUT or LUT 114. This may be accomplished by sampling the forward wave with sampler 109 when the controller 110 sends a sampler control signal to the sampler 109 via line 115.

Step 206 includes removing the driving signal source 104. Step 206 may be implemented by interrupting the signal with switches 105 and 106 controlled by controller 110. Step 208 includes a delay between the interruption of the driving signal and the sampling of the signal reflected from the DUT or LUT 114 (step 210).

Finally, the reflection coefficient of the DLTR 114 is calculated (step 212) base on a series of samples sufficient to measure the amplitude and phase of the reflected signal as recognized by a person of ordinary skill in the art. The reflection coefficient may be calculated by the ratio of the reflected wave voltage to the forward wave voltage. The forward wave data is obtained in step 204 and the reflected wave data is obtained in step 210. The phase difference between the detected forward and reflected waves has an offset due to the delay in sampling times. Step 212 may include dividing a magnitude of a first complex number pair corresponding to the sampled reflected signal by a magnitude of a second complex number pair corresponding to the measured forward wave. Further, the angle or phase difference may be calculated by determining the difference between angles of two vectors represented by the complex number pairs.

The foregoing description of preferred embodiments of the present invention provides an exemplary illustration and description, but is not intended to be exhaustive or to limit the invention to the precise form disclosed. Modifications and variations are possible in light of the above teachings or may be acquired from practice of the invention.

What is claimed is:

1. A method for measuring a reflection coefficient of a network comprising:

exciting the network with a forward wave so that the forward wave is incident on the network;

interrupting a source of the forward wave;

sampling a signal reflected from the network after a predetermined delay after the source is interrupted; and calculating a reflection coefficient of the network by using the sampled reflected signal.

2. The method of claim 1, further comprising the step of measuring the forward wave when it is incident on the network.

3. The method of claim 2, wherein the calculating step comprises dividing a magnitude of first complex number pair corresponding to the sampled reflected signal by a magnitude of second complex number pair corresponding to the measured forward wave.

4. The method of claim 3, wherein the calculating step comprises calculating an angle by calculating the difference between angles of two vectors represented by the complex number pairs.

5. The method of claim 1, wherein the step of sampling a signal reflected comprises sampling the signal reflected from the network at a sampling rate different from the frequency of the forward wave.

6. The method of claim 1, wherein the interrupting includes:

ceasing a supply of the forward wave to the network.

7. A method for measuring a reflection coefficient of a network operatively coupled to a signal source, said method comprising:

outputting a forward wave from said signal source;

propagating said forward wave to said network;

controlling interruption of said forward wave to obtain an interrupted forward wave;

sampling a wave reflected from said network; and, initiating said sampling after said controlling and during said interrupted forward wave.

8. The method of claim 7, wherein said propagating includes:

directional coupling to couple said forward wave in a particular direction within said network.

9. The method of claim 8 wherein said propagating includes:

directional bridging to bridge said forward wave in a particular direction within said network.

10. The method of claim 7, further comprising:

connecting said signal source to allow said propagating;

sending a control signal; and obtaining said interrupted forward wave in response to said sending.

11. The method of claim 7, wherein the propagating of the forward wave to the network ceases during the interrupted forward wave.

\* \* \* \* \*